United States Patent
Pan et al.

(10) Patent No.: US 9,368,212 B1
(45) Date of Patent: Jun. 14, 2016

(54) MEMORY WITH TEMPERATURE COEFFICIENT TRIMMING

(71) Applicant: MICRON TECHNOLOGY, INC., Boise, ID (US)

(72) Inventors: Feng Pan, Fremont, CA (US); Qiang Tang, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/669,705

(22) Filed: Mar. 26, 2015

(51) Int. Cl.
*G11C 19/08* (2006.01)
*G11C 16/06* (2006.01)
*G11C 29/12* (2006.01)

(52) U.S. Cl.
CPC ............. *G11C 16/06* (2013.01); *G11C 29/12* (2013.01)

(58) Field of Classification Search
None
See application file for complete search history.

(56) References Cited

U.S. PATENT DOCUMENTS

| 5,875,142 | A | 2/1999 | Chevallier |
| 6,643,192 | B2 | 11/2003 | Marotta et al. |
| 7,277,355 | B2 | 10/2007 | Tanzawa |
| 7,489,556 | B2 | 2/2009 | Tanzawa |
| 7,630,266 | B2 | 12/2009 | Incarnati et al. |
| 8,547,746 | B2 | 10/2013 | Tanzawa |
| 2010/0073069 | A1* | 3/2010 | Wang ................ G11C 5/143 327/513 |

* cited by examiner

*Primary Examiner* — Han Yang
*Assistant Examiner* — Sultana Begum
(74) *Attorney, Agent, or Firm* — Dicke, Billig & Czaja, PLLC

(57) ABSTRACT

A device includes an array of memory cells, a temperature sensor to provide a temperature output, and a circuit. The circuit provides a bias voltage to bias a node of the array of memory cells based on the temperature output, a first voltage component independent of a temperature coefficient of the memory cells, and a second voltage component dependent on the temperature coefficient of the memory cells. The first voltage component is determined at a first temperature and the second voltage component is determined at a second temperature less than the first temperature.

27 Claims, 6 Drawing Sheets

MEMORY WITH TEMPERATURE COEFFICIENT TRIMMING

TECHNICAL FIELD

The present disclosure relates generally to temperature coefficient trimming, in particular, in one or more embodiments, the present disclosure relates to temperature coefficient trimming of a memory using a built-in self-test (BIST) of the memory.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, tablet computers, digital cameras, digital media players, cellular telephones, solid state drives and removable memory modules, and the uses are growing.

Flash memory devices may use an n-channel field-effect transistor (nFET) for each memory cell. An nFET has a negative temperature coefficient. As such, the threshold voltage ($V_t$) to turn on an nFET decreases as the temperature of the nFET increases.

For the reasons stated above, and for other reasons stated below which will become apparent to those skilled in the art upon reading and understanding the present specification, there is a need in the art for alternative methods for temperature coefficient trimming of a memory device, and apparatus to perform such methods.

DETAILED DESCRIPTION

Figure 1A:
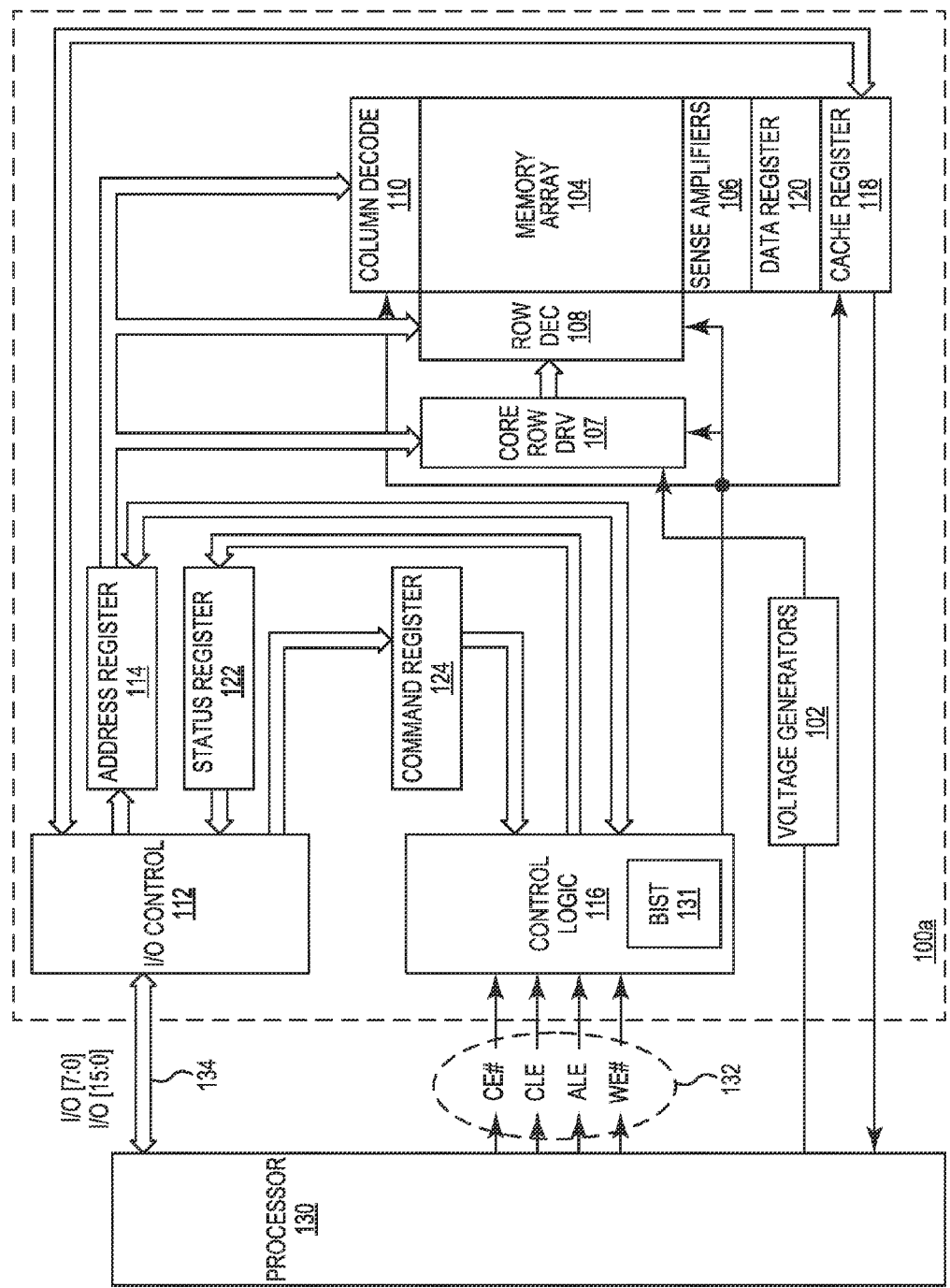
FIG. 1A is a simplified block diagram of one embodiment of a memory device in communication with a processor as part of an electronic system.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Flash memory devices may use an n-channel field-effect transistor (nFET) for each memory cell. An nFET has a negative temperature coefficient. As such, the threshold voltage ($V_t$) to turn on an nFET decreases as the temperature of the nFET increases. The gate to source voltage ($V_{gs}$) minus the threshold voltage of an nFET memory cell should be substantially the same at any temperature of the array of memory cells to provide improved device margin for threshold voltage budgeting. Accordingly, this disclosure describes embodiments for temperature coefficient trimming of a memory such that the temperature coefficient of a biasing circuit for a node of the memory matches the temperature coefficient of the memory cells. The node may be an access line of an array of memory cells, a data line of an array of memory cells, or a source of an array of memory cells. While the following description refers to a word line biasing circuit, the biasing circuit is also applicable to biasing other nodes of the memory, such as a data line or a source of an array of memory cells.

FIG. 1A is a simplified block diagram of a first apparatus, in the form of a memory device 100a, in communication with a second apparatus, in the form of a processor 130, as part of a third apparatus, in the form of an electronic system, according to an embodiment. Some examples of electronic systems include personal computers, tablet computers, digital cameras, digital media players, digital recorders, games, appliances, vehicles, wireless devices, cellular telephones and the like. The processor 130, e.g., a controller external to the memory device 100a, may be a memory controller or other external host device. Processor 130 may include built-in self-test (BIST) logic (not shown) for testing memory device 100a and for temperature coefficient trimming of memory device 100a. In this example, the BIST logic may be external to a die that includes memory device 100a.

Memory device 100a includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1A) of at least a portion of array of memory cells 104 are capable of being programmed to one of at least two data states.

Memory device 100a includes voltage generators 102 communicatively coupled between processor 130 and core row driver circuitry 107. One of the voltage generators may provide a bias voltage to core row driver 107 for biasing a node of array of memory cells 104 for read and/or verify operations. The bias voltage is based on a first voltage component independent of a temperature coefficient of the memory cells plus the product of a second voltage component dependent on the temperature coefficient of the memory cells and a sensed temperature of the array of memory cells. The first voltage component, which is set at a first temperature of memory device 100a, and the second voltage component, which is set at a second temperature of memory device 100a less than the first temperature, are determined by BIST logic within processor 130 or by BIST logic within another suitable component, such as BIST logic 131 within control logic 116, as will be further described below with reference to the following figures.

The core row driver circuitry 107, a row decode circuitry 108, and a column decode circuitry 110 are provided to decode address signals. Address signals are received and decoded to access the array of memory cells 104. Memory device 100a also includes input/output (I/O) control circuitry 112 to manage input of commands, addresses and data to the memory device 100a as well as output of data and status information from the memory device 100a. An address register 114 is in communication with I/O control circuitry 112, core row driver circuitry 107, row decode circuitry 108, and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations in accordance with embodiments described herein. The control logic 116 is in communication with core row driver circuitry 107, row decode circuitry 108, and column decode circuitry 110 to control the core row driver circuitry 107, row decode circuitry 108, and column decode circuitry 110 in response to the addresses. Control logic 116 may include BIST logic 131 for testing memory device 100a and for temperature coefficient trimming of memory device 100a. In this example, BIST logic 131 may be on a die that includes array of memory cells 104.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

In one example, during a BIST operation for temperature coefficient trimming, cache register 118 or data register 120 may count the number of memory cells conducting (also referred to as bit counting) as sensed by sense amplifiers 106 during a sweep of a word line bias voltage. The count is then communicated to processor 130 for use in determining the first voltage component and the second voltage component of the word line bias voltage. In another example, during a BIST operation for temperature coefficient trimming, processor 130 performs the bit counting using data passed to the processor 130 from cache register 118 or data register 120.

Memory device 100a receives control signals at control logic 116 from processor 130 over a control link 132. The control signals may include at least a chip enable CE#, a command latch enable CLE, an address latch enable ALE, and a write enable WE#. Additional control signals (not shown) may be further received over control link 132 depending upon the nature of the memory device 100a. Memory device 100a receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1A has been simplified. It should be recognized that the functionality of the various block components described with reference to FIG. 1A may not necessarily be segregated to distinct components or component portions of an integrated circuit device. For example, a single component or component portion of an integrated circuit device could be adapted to perform the functionality of more than one block component of FIG. 1A. Alternatively, one or more components or component portions of an integrated circuit device could be combined to perform the functionality of a single block component of FIG. 1A.

Additionally, while specific I/O pins are described in accordance with popular conventions for receipt and output of the various signals, it is noted that other combinations or numbers of I/O pins may be used in the various embodiments.

Figure 1B:
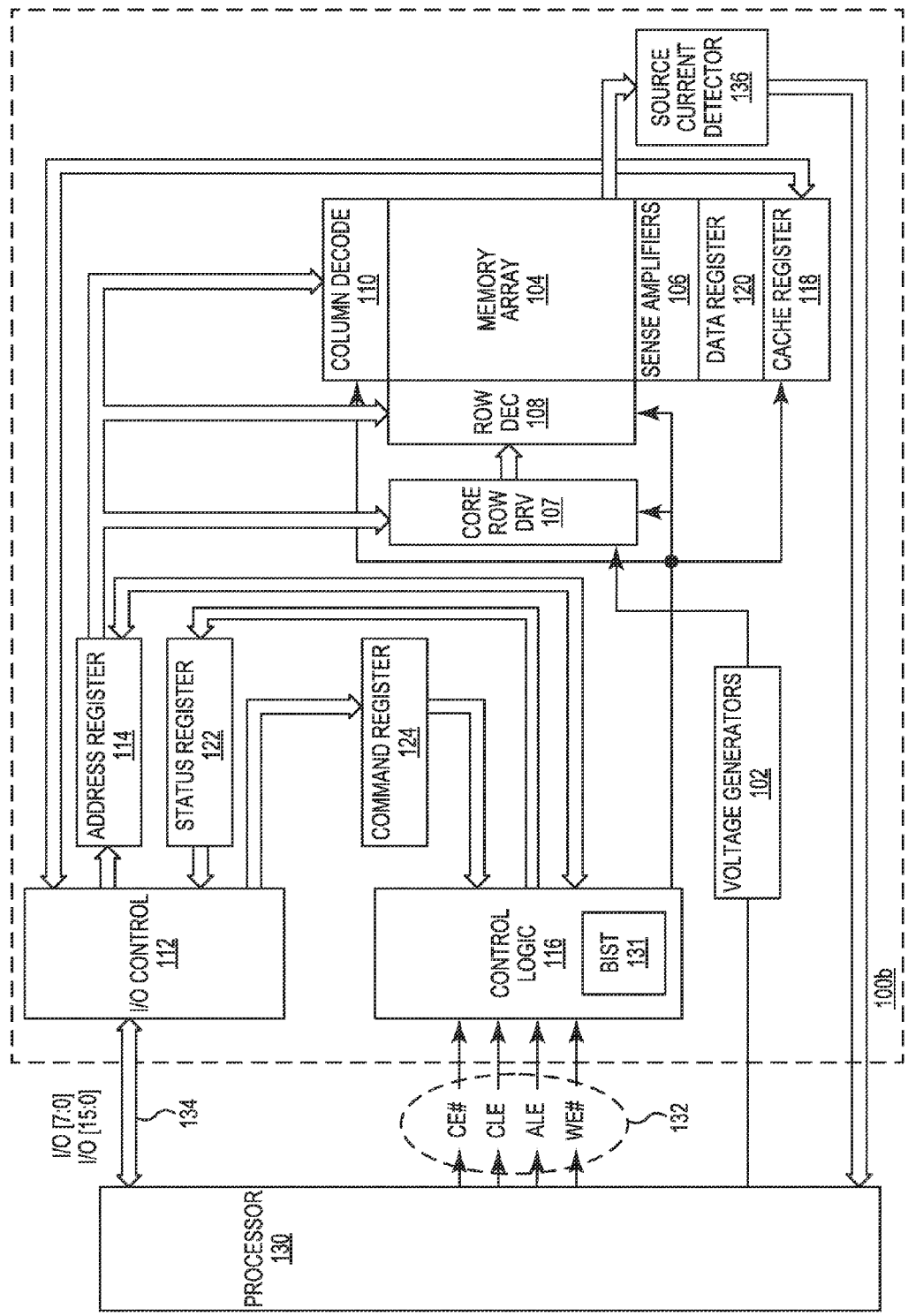
FIG. 1B is a simplified block diagram of another embodiment of a memory device in communication with a processor as part of an electronic system.

FIG. 1B is a simplified block diagram of a first apparatus, in the form of a memory device 100b, in communication with a second apparatus, in the form of a processor 130, as part of a third apparatus, in the form of an electronic system, according to another embodiment. Memory device 100b is similar to memory device 100a previously described and illustrated with reference to FIG. 1A, except that memory device 100b includes source current detector circuitry 136 communicatively coupled between array of memory cells 104 and processor 130.

In this embodiment, source current detector 136 is used during a BIST operation for temperature coefficient trimming in place of bit counting to determine the number of memory cells conducting during a sweep of a word line bias voltage. Each memory cell that is conducting in response to a word line bias voltage contributes to the source current of array of memory cells 104. Therefore, by detecting the source current from array of memory cells 104, the number of conducting memory cells can be determined.

Figure 2:
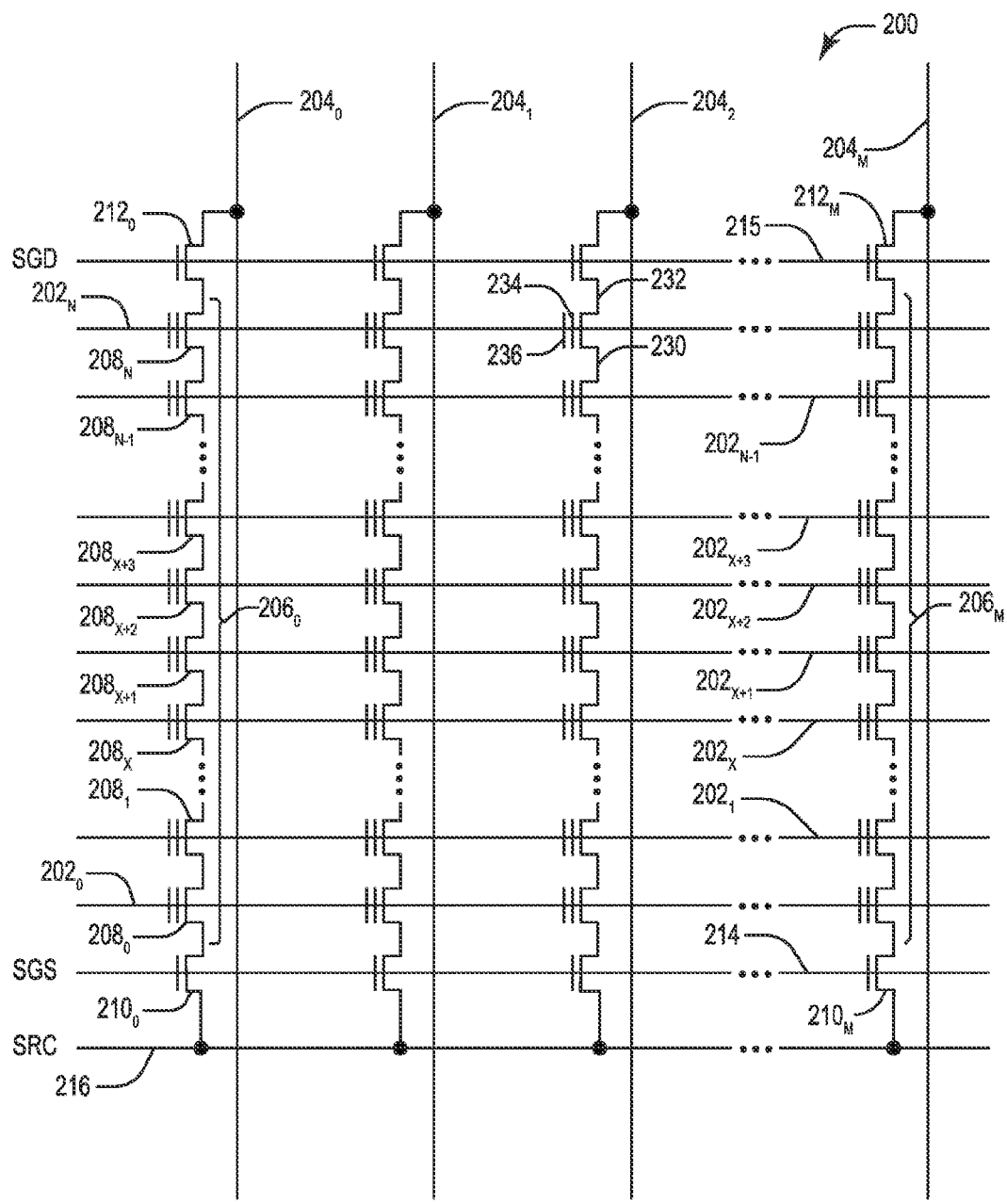
FIG. 2 is a schematic of a portion of an array of memory cells as could be used in a memory device of the type described with reference to FIG. 1A or FIG. 1B.

FIG. 2 is a schematic of a NAND memory array 200, e.g., as a portion of array of memory cells 104. Memory array 200 includes access lines, such as word lines $202_0$ to $202_N$, and data lines, such as bit lines $204_0$ to $204_M$. The word lines 202 may be coupled to global access lines (e.g., global word lines), not shown in FIG. 2, in a many-to-one relationship. For some embodiments, memory array 200 may be formed over a semiconductor that, for example, may be conductively doped to have a conductivity type, such as a p-type conductivity, e.g., to form a p-well, or an n-type conductivity, e.g., to form an n-well.

Memory array 200 might be arranged in rows (each corresponding to a word line 202) and columns (each corresponding to a bit line 204). Each column may include a string of series-coupled memory cells, such as one of NAND strings $206_0$ to $206_M$. Each NAND string 206 might be coupled to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly coupled to a select line 214, such as a source select line, and select transistors $212_0$ to $212_M$ might be commonly coupled to a select line 215, such as a drain select line.

A source of each select transistor 210 might be connected to common source 216. The drain of each select transistor 210 might be connected to the source of a memory cell $208_0$ of the corresponding NAND string 206. For example, the drain of select transistor $210_0$ might be connected to the source of memory cell $208_0$ of the corresponding NAND string $206_0$. Therefore, each select transistor 210 might be configured to selectively couple a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to the drain of a memory cell $208_N$ of the corresponding NAND string 206. For example, the source of select transistor $212_0$ might be connected to the drain of memory cell $208_N$ of the corresponding NAND string $206_0$. Therefore, each select transistor 212 might be configured to selectively couple a corresponding NAND string 206 to a corresponding bit line 204. A control gate of each select transistor 212 might be connected to select line 215.

The memory array in FIG. 2 might be a quasi-two-dimensional memory array and might have a generally planar structure, e.g., where the common source 216, strings 206 and bit lines 204 extend in substantially parallel planes. Alternatively, the memory array in FIG. 2 might be a three-dimensional memory array, e.g., where strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data value of the cell (e.g., through changes in threshold voltage), and a control gate 236, as shown in FIG. 2. Memory cells 208 may further have a defined source 230 and a defined drain 232. Memory cells 208 have their control gates 236 coupled to (and in some cases form) a word line 202.

A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 may often be divided into one or more groups of physical pages of memory cells 208, and physical pages of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one physical page of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2, it is apparent from the figure that the bit lines 204 of the array of memory cells 200 may be numbered consecutively from bit line $204_0$ to bit line $204_M$. Other groupings of memory cells 208 commonly coupled to a given word line 202 may also define a physical page of memory cells 208. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Although the example of FIG. 2 is discussed in conjunction with NAND flash, the embodiments described herein are not limited to a particular array architecture or structure, and can include other structures (e.g., cross-point memory, DRAM, etc.) and other architectures (e.g., AND arrays, NOR arrays, etc.).

Figure 3:
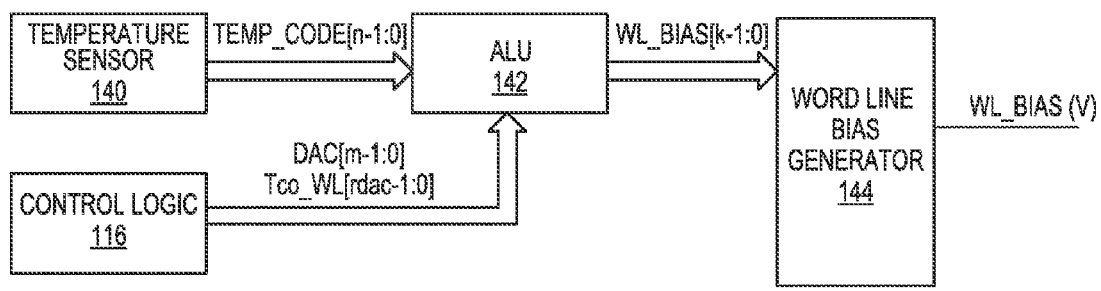
FIG. 3 is a simplified block diagram of one embodiment of a voltage generator circuit for generating a word line bias voltage.

FIG. 3 is a simplified block diagram of one embodiment of a voltage generator circuit for generating a word line bias voltage. In one embodiment, temperature sensor 140, arithmetic logic unit (ALU) 142, and word line bias generator 144 are part of voltage generators 102 (FIGS. 1A and 1B). Temperature sensor 140 senses the temperature of the memory device including the array of memory cells and provides a temperature output Temp_code[n−1:0] to ALU 142 based on the sensed temperature, where "n" is any suitable number of bits (e.g., 8 bits). Temperature sensor 140 is arranged near memory array 200 (FIG. 2). Control logic 116 provides a first voltage component DAC[m−1:0] and a second voltage component Tco_WL[rdac−1:0] to ALU 142 for generating a word line bias voltage, where "m" is any suitable number of bits (e.g., 8 bits) and "rdac" is any suitable number of bits (e.g., 4 bits). The first voltage component DAC[m−1:0] of the word line bias voltage is independent of the temperature coefficient of the memory cells. The second voltage component Tco_WL[rdac−1:0] is dependent on the temperature coefficient of the memory cells. The value of first voltage component DAC[m−1:0] and the value of second voltage component Tco_WL[rdac−1:0] are determined by BIST 131 as will be further described below with reference to the following figures.

ALU 142 calculates a digital word line bias WL_BIAS[k−1:0] based on the temperature output Temp_code[n−1:0], the first voltage component DAC[m−1:0], and the second voltage component Tco_WL[rdac−1:0]. WL_BIAS[k−1:0] may be calculated as follows:

$$WL\_BIAS[k-1:0]=(DAC[m-1:0]+Temp\_code[n-1:0]\\ *Tco\_WL[rdac-1:0])V_{LSB}$$

where:

$V_{LSB}$ is the least significant bit of the word line bias generator 144. ALU 142 passes WL_BIAS[k−1:0] to word line bias generator 144.

Word line bias generator 144 is a digital-to-analog converter to convert the digital value of the word line bias WL_BIAS[k−1:0] to an analog voltage WL_BIAS (V). The word line bias voltage WL_BIAS (V) is passed to core row driver circuitry 107 (FIGS. 1A and 1B) to bias a word line of array of memory cells 104 for read and/or verify operations.

Figure 4:
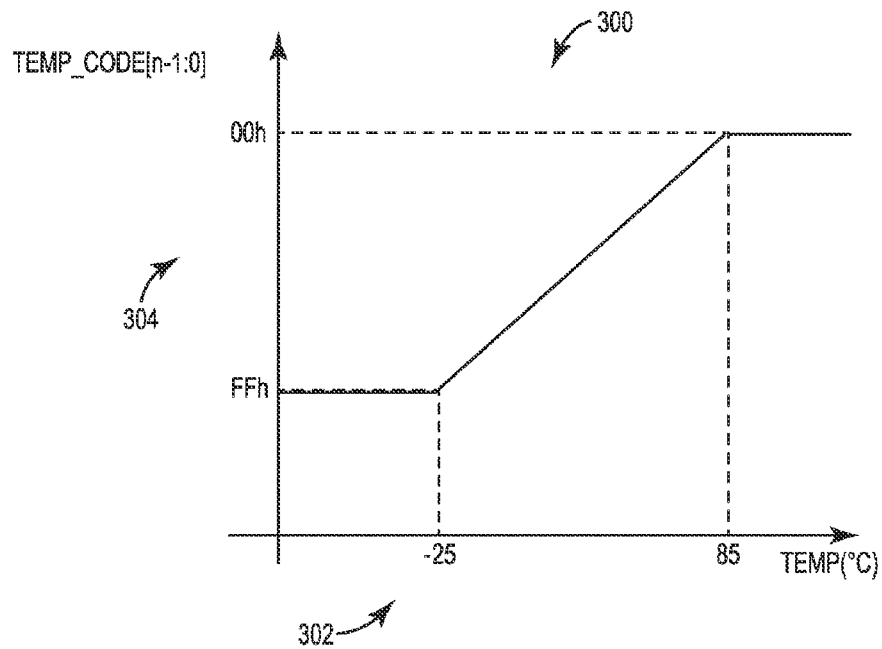
FIG. 4 is a chart illustrating one embodiment of an output of a temperature sensor.

FIG. 4 is a chart 300 illustrating one embodiment of an output of temperature sensor 140 (FIG. 3). Chart 300 includes the temperature sensed by temperature sensor 140 in degrees Celsius on x-axis 302 and the corresponding Temp_code[n−1:0] output by temperature sensor 140 on y-axis 304. The temperature sensed by temperature sensor 140 is converted into a digital value Temp_code[n−1:0], where "n" equals 8 in this example. At −25° C. and below, temperature sensor 140 outputs a Temp_code[n−1:0] saturated to FFh. At 85° C. and above, temperature sensor 140 outputs a Temp_code[n−1:0] saturated to 00h. Between −25° C. and 85° C., temperature sensor 140 outputs a corresponding Temp_code[n−1:0] between 00h and FFh. While temperature sensor 140 is referenced to 85° C. in this example, in other examples temperature sensor 140 may be referenced to another suitable temperature.

Figure 5:
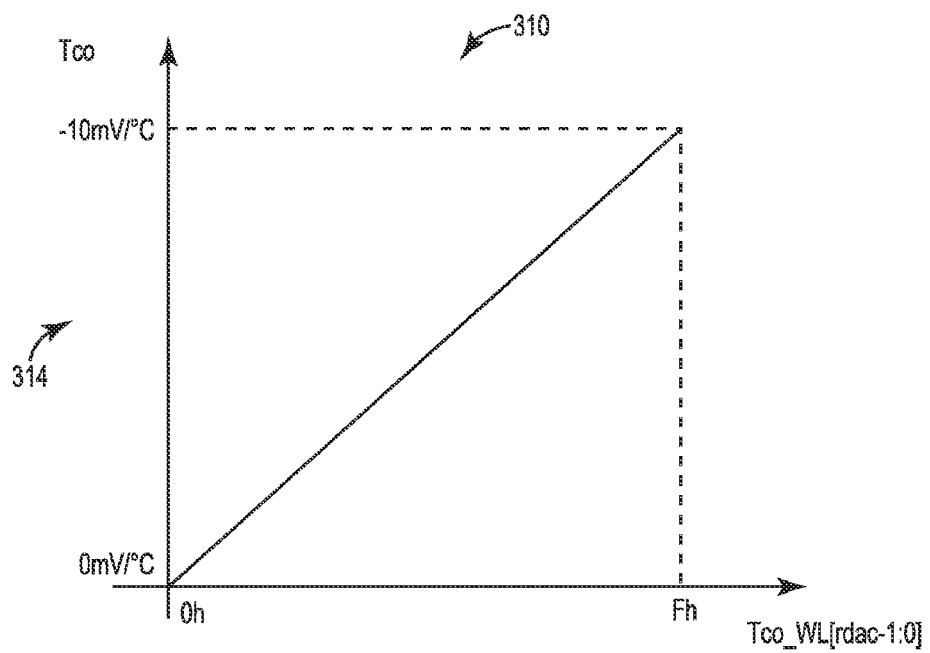
FIG. 5 is a chart illustrating one embodiment for determining the temperature coefficient of a memory cell.

FIG. 5 is a chart 310 illustrating one embodiment for determining the temperature coefficient of a memory cell. Chart 310 includes Tco_WL[rdac−1:0] on x-axis 312 and the temperature coefficient of the memory cells (Tco) on y-axis 314. In this example, the temperature coefficient of the memory cells may be within the range between 0 mV/° C. and −10 mV/° C. For a temperature coefficient of 0 mV/° C., Tco_WL[rdac−1:0] equals 0h. For a temperature coefficient of −10 mV/° C., Tco_WL[rdac−1:0] equals Fh. For a temperature coefficient between 0 mV/° C. and −10 mV/° C., Tco_WL[rdac−1:0] equals a corresponding value between 0h and Fh. As will be described in more detail below, during a BIST operation, the value of Tco_WL[rdac−1:0] is incremented or decremented to determine the temperature coefficient of the memory cells to set the value of Tco_WL[rdac−1:0].

Figure 6:
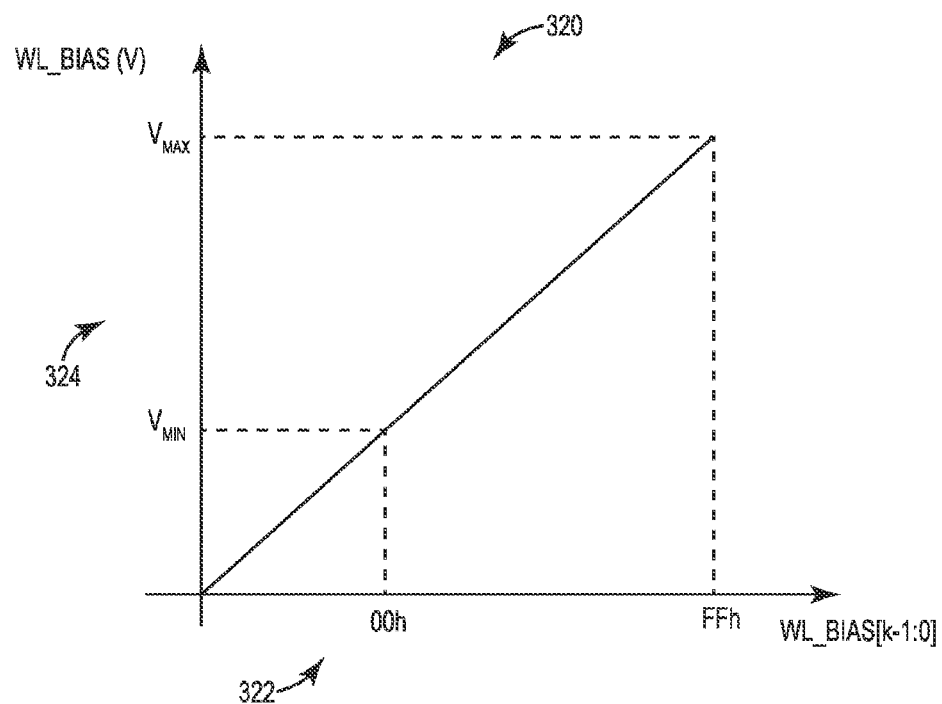
FIG. 6 is a chart illustrating one embodiment of a digital-to-analog conversion of a word line bias.

FIG. 6 is a chart 320 illustrating one embodiment of a digital-to-analog conversion of a word line bias. Chart 320 includes the digital word line bias WL_BIAS[k−1:0] on x-axis 322 and the analog word line bias voltage WL_BIAS (V) on y-axis 324. In this example, the digital word line bias WL_BIAS[k−1:0] output by ALU 142 (FIG. 3) is converted into an analog word line bias voltage WL_BIAS (V) by word line bias generator 144 (FIG. 3), where "k" equals 8 in this example. Word line bias generator 144 has a range between a minimum output voltage (Vmin) and a maximum output voltage (Vmax). For a WL_BIAS[k−1:0] equal to 00h, word line bias generator 144 outputs a WL_BIAS (V) equal to the minimum voltage. For a WL_BIAS[k−1:0] equal to FFh, word line bias generator 144 outputs a WL_BIAS (V) equal to the maximum voltage. For a WL_BIAS[k−1:0] between 00h and FFh, word line bias generator 144 outputs a corresponding WL_BIAS (V) equal to a voltage between the minimum voltage and the maximum voltage.

Figure 7:
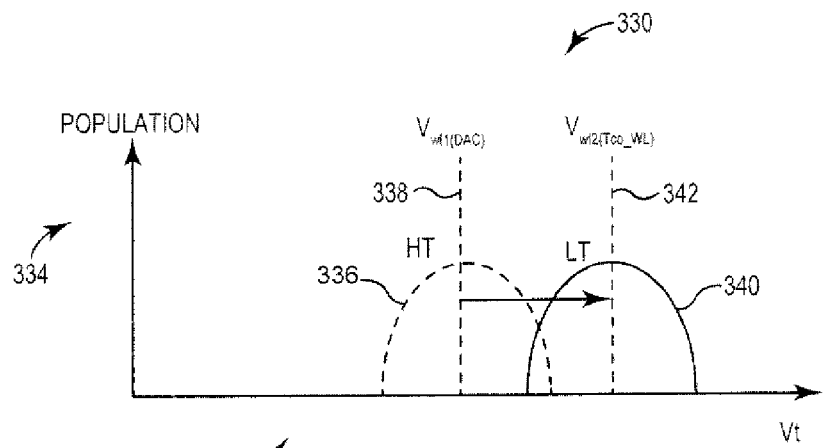
FIG. 7 is a chart illustrating one embodiment for temperature coefficient trimming of a memory.

FIG. 7 is a chart 330 illustrating one embodiment for temperature coefficient trimming of a memory. Chart 330 includes threshold voltage ($V_t$) on x-axis 332 and the population of memory cells along a group (e.g., row) of the array of memory cells on y-axis 334. The population of memory cells versus threshold voltage at a first temperature, i.e., a high temperature (HT) (e.g., 85° C.) is illustrated at 336. The population of the memory cells versus threshold voltage at a second temperature less than the first temperature, i.e. a low temperature (LT) (e.g., 25° C.) is illustrated at 340.

At the high temperature, the first voltage component of the word line bias voltage (i.e., the component independent of the temperature coefficient of the memory cells) is determined by BIST 131 (FIGS. 1A and 1B). At the high temperature, DAC [m−1:0] is swept until substantially a selected number of memory cells are conducting as indicated for example by first word line bias voltage $V_{wl1(DAC)}$ 338 while Tco_WL(rdac−1:0) is set equal to zero to set the temperature coefficient to 0 mV/° C. In this example, the selected number of memory cells equals substantially 50% of the memory cells along a row of the array of memory cells. In one example to sweep DAC[m−1:0], the value of DAC[m−1:0] is decremented from FFh toward 00h, where "m" equals 8 bits in this example, until substantially the selected number of memory cells are conducting. In another example to sweep DAC[m−1:0], the value of DAC[m−1:0] is incremented from 00h toward FFh, where "m" equals 8 bits in this example, until substantially the selected number of memory cells are conducting. When substantially the selected number of memory cells are conducting, the current value of DAC[m−1:0] is stored in the memory device, such as in array of memory cells 104. The stored value of DAC[m−1:0] provides the first voltage component for generating the word line bias voltage for read and/or verify operations.

At the low temperature, the second voltage component of the word line bias voltage (i.e., the component dependent on the temperature coefficient of the memory cells) is determined by BIST 131. At the low temperature, Tco_WL[rdac−1:0] is swept while keeping DAC[m−1:0] at the previously set value until substantially the selected number of memory cells are conducting as indicated for example by second word line bias voltage $V_{wl2(Tco\_WL)}$ 342. The selected number of memory cells is the same selected number of memory cells as when setting DAC[m−1:0]. In one example to sweep Tco_WL[rdac−1:0], the value of Tco_WL[rdac−1:0] is decremented from Fh toward 0h, where "rdac" equals 4 bits in this example, until substantially the selected number of memory cells are conducting. In another example to sweep Tco_WL[rdac−1:0], the value of Tco_WL[rdac−1:0] is incremented from 0h toward Fh, where "rdac" equals 4 bits in this example, until substantially the selected number of memory cells are conducting. When substantially the selected number of memory cells are conducting, the current value of Tco_WL[rdac−1:0] is stored in the memory device, such as in array of memory cells 104. The stored value of Tco_WL[rdac−1:0] provides the second voltage component for generating the word line bias voltage for read and/or verify operations. The stored value of Tco_WL[rdac−1:0] allows the temperature coefficient of the memory cells to be determined. As such, BIST trimming compensates for variations in circuits and in memory cells.

In one embodiment, bit counting is used to determine whether substantially the selected number of memory cells are conducting. For example, the center of the population of memory cells may be determined by counting down to substantially 50% of the memory cells conducting while the word line bias voltage is stepped from a voltage higher than the threshold voltage of the memory cells toward a voltage less than the threshold voltage of the memory cells. Alternatively, the center of the population of memory cells may be determined by counting up to substantially 50% of the memory cells conducting while the word line bias voltage is stepped from a voltage less than the threshold voltage of the memory cells toward a voltage greater than the threshold voltage of the memory cells. In another example 1% of the memory cells or another suitable percentage of the memory cells may be counted while the word line bias voltage is stepped to detect an edge of the population.

In another embodiment, the source current from the array of memory cells is detected by source current detector 136 (FIG. 1B) to determine whether substantially the selected number of memory cells are conducting. Since each conducting memory cell results in a source current, the sum of the source currents from the conducting memory cells provides an indication of the number of memory cells conducting.

Figure 8:
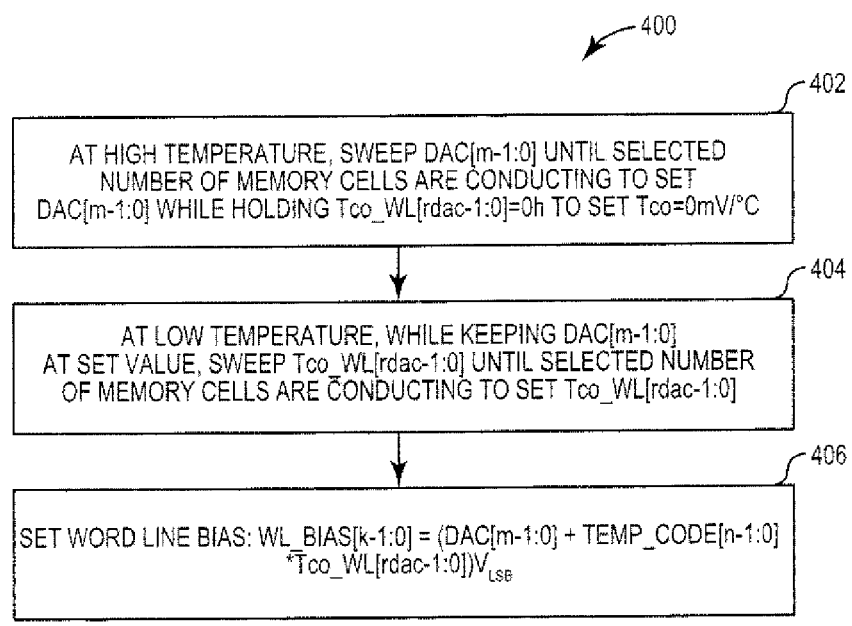
FIG. 8 is a flow diagram illustrating one embodiment of a process for temperature coefficient trimming of a memory.

FIG. 8 is a flow diagram illustrating one embodiment of a process 400 for temperature coefficient trimming of a memory. At 402, at a high temperature (e.g., greater than or equal to 85° C.), process 400 include sweeping the first voltage component DAC[m−1:0] of the word line bias voltage until the selected number of memory cells are conducting to set DAC[m−1:0] while holding the second voltage component Tco_WL[rdac−1:0] of the word line bias voltage equal to 0h so that the temperature coefficient of the memory cells Tco is set equal to 0 mV/° C. At 404, at a low temperature (e.g., less than or equal to 25° C.), while keeping the first voltage component DAC[m−1:0] at the previously set value, process 400 includes sweeping the second voltage component Tco_WL[rdac−1:0] until the selected number of memory cells are conducting to set Tco_WL[rdac−1:0]. At 406, process 400 includes setting the word line bias WL_BIAS [k−1:0]=(DAC[m−1:0]+Temp_code[n−1:0]*Tco_WL[rdac−1:0]) $V_{LSB}$. As previously described, WL_BIAS[k−1:0] is the digital value of the word line bias used to generate the analog word line bias voltage WL_BIAS (V) for biasing a word line of the array of memory cells for read and/or verify operations.

Embodiments of the disclosure trim the temperature coefficient of the biasing circuit to match the actual temperature coefficient of the memory cells, rather than to a design target that may not match the actual temperature coefficient of the memory cells. Thus, lot to lot and die to die variations may be minimized and device margin for threshold voltage budgeting may be gained.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A device comprising:
an array of memory cells;
a temperature sensor to provide a temperature output; and
a circuit to provide a bias voltage to bias a node of the array of memory cells based on the temperature output, a first voltage component independent of a temperature coefficient of the memory cells, and a second voltage component dependent on the temperature coefficient of the memory cells, the first voltage component determined at a first temperature, and the second voltage component determined at a second temperature less than the first temperature.

2. The device of claim 1, wherein the first voltage component is set to a value where substantially a selected number of the memory cells within a group of memory cells are conducting at the first temperature with the second voltage component set equal to zero.

3. The device of claim 1, wherein the second voltage component is set to a value such that when the second voltage component times the temperature output is added to the first voltage component substantially a selected number of the memory cells within a group of memory cells are conducting at the second temperature.

4. The device of claim 1, wherein the first voltage component is set to a value where substantially 50% of the memory cells within a group of memory cells are conducting at the first temperature with the second voltage component set equal to zero.

5. The device of claim 1, wherein the second voltage component is set to a value such that when the second voltage component times the temperature output is added to the first voltage component substantially 50% of the memory cells within a group of memory cells are conducting at the second temperature.

6. The device of claim 1, wherein the bias voltage is based on the first voltage component plus the product of the second voltage component and the temperature output.

7. The device of claim 1, wherein the first temperature is greater than or equal to 85° C., and wherein the second temperatures is less than or equal to 25° C.

8. The device of claim 1, wherein the array of memory cells comprises a NAND flash memory array.

9. The device of claim 1, wherein the node comprises an access line of the array of memory cells.

10. The device of claim 1, wherein the node comprises a source of the array of memory cells.

11. The device of claim 1, wherein the node comprises a data line of the array of memory cells.

12. A device comprising:
an array of memory cells;
a temperature sensor to provide a temperature output; and
built-in self-test (BIST) logic to provide a first voltage component and a second voltage component to generate a bias voltage for a group of memory cells based on the first voltage component plus the second voltage component times the temperature output, the first voltage component set such that substantially a selected number of the memory cells within the group of memory cells are conducting at a first temperature with the second voltage component set to zero, and the second voltage component set such that the selected number of the memory cells within the group of memory cells are conducting at a second temperature less than the first temperature.

13. The device of claim 12, further comprising:
a source current detector to detect whether substantially the selected number of memory cells within the group of memory cells are conducting.

14. The device of claim 12, wherein the BIST logic detects whether substantially the selected number of memory cells within the group of memory cells are conducting by bit counting.

15. The device of claim 12, further comprising:
a cache register electrically coupled to the array of memory cells, the cache register to detect whether substantially the selected number of memory cells within the group of memory cells are conducting by bit counting.

16. The device of claim 12, further comprising:
a data register electrically coupled to the array of memory cells, the data register to detect whether substantially the selected number of memory cells within the group of memory cells are conducting by bit counting.

17. The device of claim 12, wherein the BIST logic is on a die that includes the array of memory cells.

18. The device of claim 12, wherein the BIST logic is external to a die that includes the array of memory cells.

19. The device of claim 12, wherein the array of memory cells comprises an array of re-channel field-effect transistor (nFET) memory cells.

20. The device of claim 12, wherein the array of memory cells comprises a three-dimensional array of memory cells.

21. A method comprising:
sensing a temperature of an array of memory cells to provide a temperature output;
generating a bias voltage for a group of memory cells based on a first voltage component plus the product of a second voltage component and the temperature output;
sweeping the first voltage component of the bias voltage for the group of memory cells at a first temperature with the second voltage component equal to zero to determine a first value of the first voltage component at which substantially a selected number of the memory cells are conducting; and
sweeping the second voltage component of the bias voltage for the group of memory cells at a second temperature less than the first temperature with the first voltage component equal to the first value to determine a second value of the second voltage component at which substantially the selected number of the memory cells are conducting.

22. The method of claim 21, wherein sweeping the first voltage component of the bias voltage for the group of memory cells at the first temperature comprises decrementing the first voltage component from a higher value toward a lower value until substantially the selected number of memory cells are conducting.

23. The method of claim 21, wherein sweeping the second voltage component of the bias voltage for the group of memory cells at the second temperature comprises decrementing the second voltage component from a higher value toward a lower value until the selected number of memory cells are conducting.

24. The method of claim 21, wherein sweeping the first voltage component of the bias voltage for the group of memory cells at the first temperature comprises incrementing the first voltage component from a lower value toward a higher value until substantially the selected number of memory cells are conducting.

25. The method of claim 21, wherein sweeping the second voltage component of the bias voltage for the group of memory cells at the second temperature comprises incrementing the second voltage component from a lower value toward a higher value until the selected number of memory cells are conducting.

26. The method of claim 21, further comprising:
bit counting to determine whether substantially the selected number of the memory cells are conducting.

27. The method of claim 21, further comprising:
detecting a source current of the array of memory cells to determine whether substantially the selected number of the memory cells are conducting.

\* \* \* \* \*